United States Patent

Wittens

[11] Patent Number: 5,187,863
[45] Date of Patent: Feb. 23, 1993

[54] METHOD AND DEVICE FOR CONNECTING A CONNECTOR TO A BOARD

[75] Inventor: Henricus L. Wittens, Oisterwijk, Netherlands

[73] Assignee: E. I. Du Pont de Nemours and Company, Wilmington, Del.

[21] Appl. No.: 857,524

[22] Filed: Mar. 25, 1992

[30] Foreign Application Priority Data

Mar. 27, 1991 [NL] Netherlands ............... 9100546

[51] Int. Cl.$^5$ ............... H01R 9/14; B23P 19/00
[52] U.S. Cl. ............... 29/845; 29/741; 29/856; 228/5.1; 228/6.2; 228/180.2; 228/222
[58] Field of Search ............... 29/856, 450, 512, 845, 29/739; 228/5.1, 6.2, 222, 223, 180.2

[56] References Cited

U.S. PATENT DOCUMENTS

| 453,182 | 6/1891 | Gaines . | |
|---|---|---|---|
| 2,456,118 | 12/1948 | Foste | 29/856 X |
| 2,521,505 | 9/1950 | Doyle | 33/181 |
| 2,941,428 | 6/1960 | Riggio et al. | 78/42 |
| 3,367,809 | 2/1968 | Soloff | 156/73 |
| 4,041,596 | 8/1977 | Mink | 29/243.53 |
| 4,181,698 | 1/1980 | Hayes et al. | 264/249 |
| 4,196,509 | 4/1980 | Del Rico | 29/845 X |
| 4,633,559 | 1/1987 | Loren | 29/243.5 |
| 4,644,643 | 2/1987 | Sudo | 29/845 |
| 4,767,298 | 8/1988 | Bocchicchio et al. | 425/112 |
| 4,949,450 | 8/1990 | Schorres | 29/845 X |
| 5,025,553 | 6/1991 | Telco | 29/845 X |
| 5,050,296 | 9/1991 | Emerich et al. | 29/845 |

Primary Examiner—Carl J. Arbes

[57] ABSTRACT

A method and apparatus for fixing a connector having pins onto a printed circuit board wherein the apparatus is movable between a position rear the pins and a position retracted from the pins. The apparatus includes heating means and pressure heads which act in a complimentary manner. After the pins are heated and are cooling, the pressure heads upset the pins thereby strengthening the connection.

9 Claims, 2 Drawing Sheets

METHOD AND DEVICE FOR CONNECTING A CONNECTOR TO A BOARD

BACKGROUND OF THE INVENTION

1. Field of the Invention

The invention relates to a method and a device for fixing a connector on a printed circuit board, which connector is provided with fixing pins which are inserted into corresponding holes in the board, and are then heated and upset by means of a press tool at the side of the board facing away from the connector, in order to form a fixing head.

2. Description of Related Art

Methods are generally known, in particular, for fixing connectors which permit a modular construction. This means that these connectors can be fitted next to one another without loss of position. In the case of such connectors no fixing devices can be used at the ends, so that one has to resort to fixing devices situated at the rear side of the board.

According to a known method, the fixing pins are heated by means of the press tool, which is brought to the desired temperature beforehand. Pressing the press tool in a suitable manner causes part of the pin projecting through the board to be reshaped to a head, as a result of which a sort of rivet is formed.

This known method has various disadvantages. In order to obtain a sturdy fixing of the connector on the board, the connector must be pressed hard until the head formed has cooled off and is strong enough. For this purpose the connector is held pressed between a supporting face and the above-mentioned press tool. This pressing action is not, however, achieved until after the head is already formed. Only when the press tool has reshaped the pin in such a way that a head is obtained can the board be pressed against the appropriate face of the connector.

This means that the board cannot be kept pressed constantly against the connector during the formation of the head. During the initial deformation of the pin the board lies, as it were, still loose against the connector, which can lead to undesirable movements and thereby a poor fixing. Finally, the press tool must be held against the head until the latter has cooled off sufficiently, something which can take some time, since the head itself also has a certain heat capacity.

Another disadvantage lies in the fact that the thickness of the board can vary within certain tolerances. This has a direct influence on the length of the pin part to be deformed, and thus on the volume to be reshaped. Since also the material is not impeded in the lateral direction during reshaping, in the case of a relatively thin board, and thus in the case of a relatively large volume of the pin to be reshaped, this pin material can give way laterally under the press tool. A thin, irregularly shaped edge all the way around the deformed head is consequently obtained. Apart from the fact that such an edge is not visually acceptable, it also produces the risk of polluting soldering bath through which it must be possible to pass the board with the connector. Besides, plastic particles can come off as a result.

It is also found in practice that during the heating and reshaping the pins can be pressed into a crooked position, which is also a disadvantage for the strength of the connection obtained. This also makes it difficult to hold board and connector pressed well against each other.

The boards on which the connector has to be fixed can be supplied in various standard thicknesses, for example, 1.6 and 2.4 mm. Since, as described above, the press tool according to the state of the art can function properly only if the pin is of a certain length, this means that for boards of a different thickness connectors with differing pin lengths have to be used. This is undesirable, in view of the additional costs which keeping two different types of connector in stock involves. All this could be allowed for by adapting the press tool, but the disadvantage of this is that it would have to be changed constantly.

The final disadvantage which will be mentioned is that through contact with the hot press tool the plastic material of the pins could stick, which soils the press tool and give the fixing head obtained a ragged appearance.

SUMMARY OF THE INVENTION

The object of the invention is to adapt this known method in such a way that these disadvantages are avoided. This object is achieved in that the heating of the pins is carried out contactlessly, and in that for the upsetting a press tool with a low temperature is used in such a way that the material of the pins is cooled already during the upsetting. The pin can be upset in a suitable manner in the heated stated by the press tool, while it is still ensured that the head formed in the process is cooled down rapidly, given the low temperature of the press tool. This means that a fixing with sufficient strength is obtained virtually immediately after upsetting, as a result of which the press tool can be removed again immediately. All this benefits not only the strength of the connection obtained, but also the speed of production. Given the low temperature of the press tool, sticking of the pin material is also avoided The heating of the pins does not constitute any problem in this respect either, since it takes place contactlessly.

The invention also relates to a device for carrying out this method, which device is provided with heating means for contactlessly heating the fixing pins provided on a connector, and with a press tool for upsetting said pins in the preheated state. Unlike the device according to the state of the art, the press tool according to the invention does not need to be heated, since the fixing pins can be brought to the desired temperature by means of the contactlessly operating heating means.

The heating means comprise one or more heating heads situated on a first carrier which is movable between a position near the pins for the heating thereof and a retracted position at a distance from them. The heating heads can be maneuvered by means of the carrier, in such a way that, on the one hand, they can heat the pins in the correct manner and, on the other, do not interfere with the subsequent dressing operation.

For this, the press tool has one or more pressure heads situated on a second carrier which is movable between a pressing position for upsetting the pins and a retracted position at a distance from them. In the case of the device according to the invention the heating heads and the pressure heads can thus be moved alternately into the working position and the rest position, in such a way that after the heating phase has been completed the pins can be reshaped immediately to a fixing head. It is ensured here that the material of the pins has virtually no time to cool off, so that a good result can be obtained.

The pressure heads. the heating heads and their carriers can be controlled in various ways in order to bring about the progression of the fixing operations described above. According to a preferred embodiment, the first carrier is, however, swiveleable about an axis at a relatively short distance from the mounting position for the connector, and the second carrier is swivelable about an axis at a relatively great distance from it. The pressure heads situated on the second carrier can consequently describe a path with a great curve, which means that they are movable virtually in a straight line towards the fixing pins. As a result, the formation of the fixing head can be carried out in the correct manner. The heating heads on the first carrier described a path with a greater curvature. This is, however, not a problem so long as they can be fitted at such a distance from the pins that good heating is ensured.

According to an embodiment which works well in practice, the first carrier at the side near the mounting position for the board and connector to be connected is supported on either side by an arm in each case which is hingedly fixed to the carrier at one side and a base frame at the other, the carrier being supported so that it is horizontally slidable at the side at a distance away from said mounting position, in such a way that the heating heads on the carrier essentially describe a partially circular path between their two positions. Moreover, the second carrier is hingedly suspended from the base frame approximately at the level of the place where the first carrier is supported in a slidable manner.

Various mechanisms can be used for carrying out the movements of heating heads and pressure heads relative to the pins in the correct sequence. First of all, the movement for the pressure heads and the heating heads can be ensured manually. In view of the guides provided by the carrier, this is no problem at all: the correct position of the pressure heads and heating heads relative to the pins is always ensured by them.

The device is, however, preferably designed in such a way that there is no possibility of the pressure heads moving towards the pins so long as the heating means are still situated near the pins. For this, according to the invention the base frame is provided with a control arm which is movable between a retracted position at a distance from the second carrier and a working position near said carrier, in which latter position the arm rests against said carrier. By pushing the control arm downwards, the pressure heads can be fitted in a suitable manner on the pins to be deformed.

As already mentioned above, in order to prevent the pressure heads from being operated before the heating heads are retracted, the arm is designed so that it pivots about an axis lying essentially above the hinge pin of the second carrier, while said arm near its axis is provided with at least one lever which on movement of the arm to the working position comes to rest against a stop provided on the first carrier for movement of the first carrier away from the mounting position for the connector and board during the movement of the arm to the working position, in such a way that the arm cannot move the second carrier to the pressing position until after the first carrier has moved away.

As already mentioned during the discussion of the state of the art, the pins of a connector can project to a greater or lesser extent relative to the board on which they are to be fixed. All this can be due to the tolerances of the board, but can also be due to the differing standard thicknesses which a board can have. In order to provide a perfect fixing head also in these circumstances, each pressure head has a die for upsetting a pin, and a sleeve which surrounds the die and has at one end a stop for that die, in such a way that the die can be held by a pre-tensioning device against said stop and is movable against the pre-tensioning force of the pressure device towards the other end of the sleeve by means of which it rests on the board, and in such a way that the material of the pin upset by the die is held fast inside the sleeve. Even if the pin projects relatively far relative to the board, and thus provides a relatively large quantity of material to be deformed, a good head can still be formed, since the material is held fast by the sleeve.

The result of this is that the material formed can no longer escape, so that the formation of a ragged, thin edge all way around the fixing head is avoided. Even if the head were to be crooked during the heating or reshaping, this would not have any effect on the strength, in view of the action of the sleeve, which ensures that the material comes to rest at the correct place in the head.

Contactless heating of the heads can be carried out in different ways. It is, however, preferable to use a device in which each heating head has a pipe connected to an air heating device with booster for creating a hot air flow through the pipe to heat a fixing pin.

BRIEF DESCRIPTION OF THE DRAWINGS

The invention will be explained in greater detail below with reference to an example of an embodiment described in the figures.

DESCRIPTION OF THE PREFERRED EMBODIMENT(S)

Figure 1:
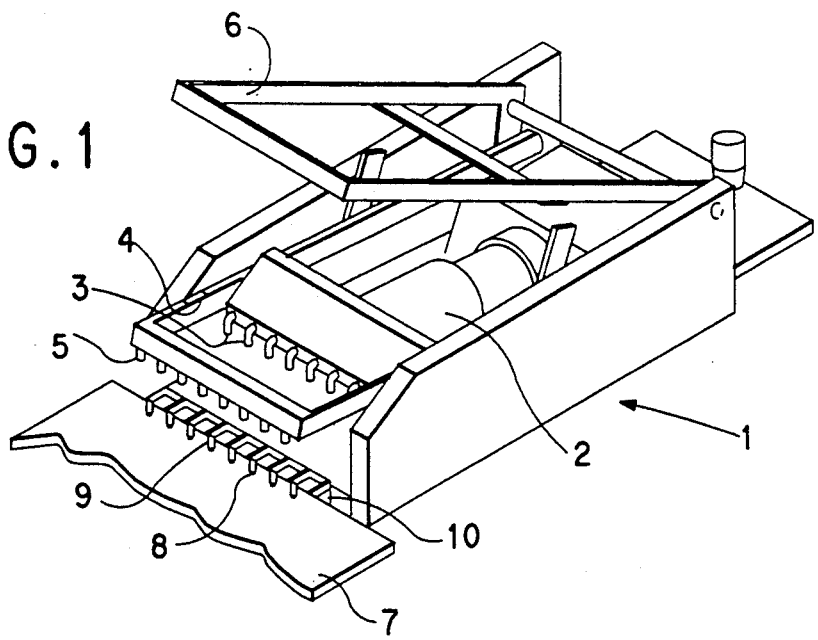
FIG. 1 shows a view in perspective of the device according to the invention.

The device according to the invention shown in FIG. 1. The device is for fixing a connector having pins on a printed circuit board by inserting the pins through holes in the board and deforming heads of the pins. The device comprises a base frame 1, in which a first carrier 2 bearing heating heads 3 on its first end is hingedly accommodated. Also hingedly accommodated in the base frame 1 is a second carrier 4 which bears pressure heads 5 at its first end. The frame 1 also has hingedly connected to it a control arm 6, the working of which will be explained later. FIG. 1 also shows a printed circuit board 7, provided with holes 8 into which the pins 9 of a connector, indicated in its entirety by 10, are inserted. The connector 10 in this illustration lies below the board 7. The pins 9 project up through the holes 8 in the board 7 and must be reshaped to a head for fixing of the connector 10 to the board 7.

Figure 2A:
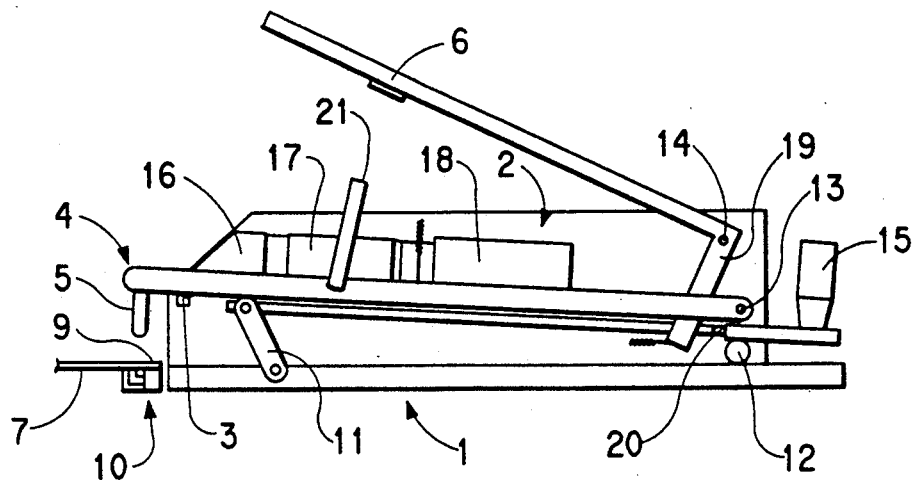
FIGS. 2a to 2c show the side views of various operating phases of the device.
Figure 2B:
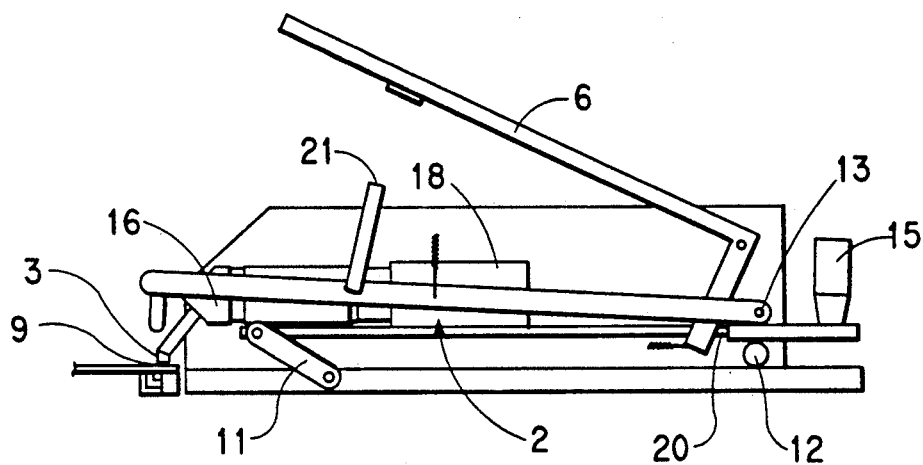
Figure 2C:
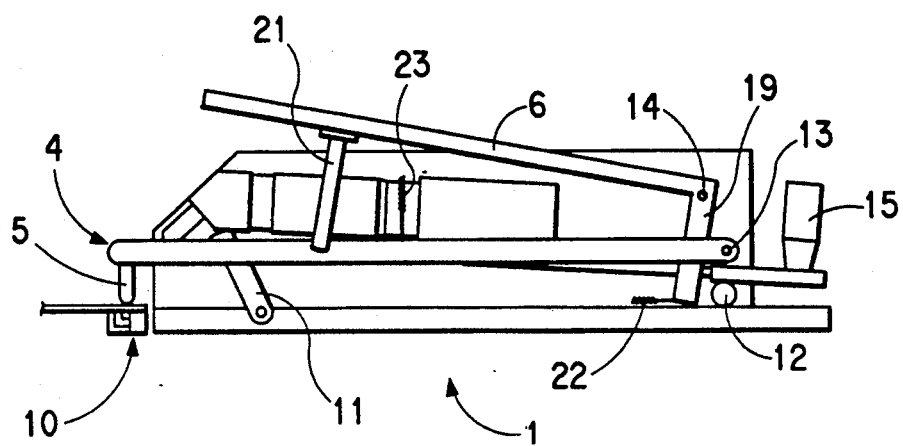

FIGS. 2a to 2c show the parts described above in various working positions. FIG. 2a shows the position corresponding to that of FIG. 1. It can also be seen clearly in it that the first carrier 2 is supported at both sides by an arm 11 which is hingedly fixed at one side to the first carrier 2, and at the other side to the base frame 1. At its second end facing away from the board 7 and connector 10, the first carrier 2 is placed on a support 12 in such a way that it can slide. In addition, a hinge or pivot point for the second carrier 4 is indicated by 13, and a hinge or pivot point for the control arm 6 is indicated by 14. Finally, a handle 15 is also provided on the first carrier 2.

The first carrier 2 can be pushed forward, i.e., towards the board 7 with connector 10 and pins 9, by means of the handle 15 (see the situation in FIG. 2b). In that position the heating heads 3 are situated above the pins 9, in such a way that they can heat the material thereof. The heating heads 3 are connected to a chamber 16 in which a hot air flow can be created or provided by means of, for example, an electric heater 17 and a fan 18.

When the pins 9 are heated to a sufficient degree, i.e., in such a way that they can easily be deformed, the heating heads 3 are removed again. For this, the control arm 6 is provided with a lever 19, which projects near its hinge point 13 in the direction of the first carrier 2. This first carrier 2 is provided with a stop 20. When the control arm 6 is now pressed downwards the lever 19 comes to rest against the stop 20, in such a way that the first carrier 2 is moved backwards. As a result of the action of the arms 11, the heating heads 3 move both backwards and upwards, in such a way that the pins 3 of the connector 10 are exposed again.

When the control arm 6 is pushed further downwards it comes into contact with the projections 21 which are provided on the second carrier arm 4. The second carrier 4 is consequently pressed downwards, in such a way that the pressure heads 5 fitted on it come into contact with the pins 9 and deform them to a head. Since the pressure heads 5 are not heated, rapid cooling of the head material is ensured, in such a way that immediately after the formation of the head the second carrier 4 can be moved up again by releasing the control arm 6 again. Under the influence of the springs 22, which are fixed at one side to the base frame 1 and at the other to the lever 19, the control arm 6 moves upwards. The second carrier 4 also moves upwards, under the influence of the springs 23 which are fixed to the base frame 1.

Figure 3A:
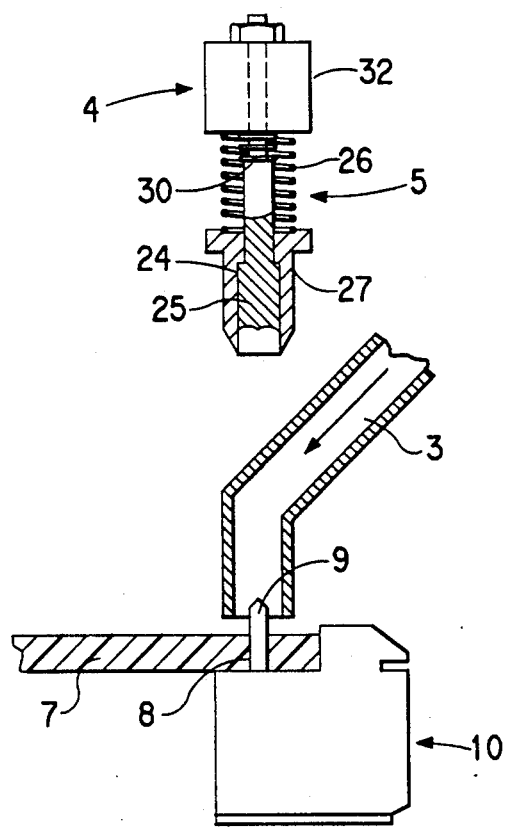
FIGS. 3a and 3b show details of the heating and upsetting device.
Figure 3B:
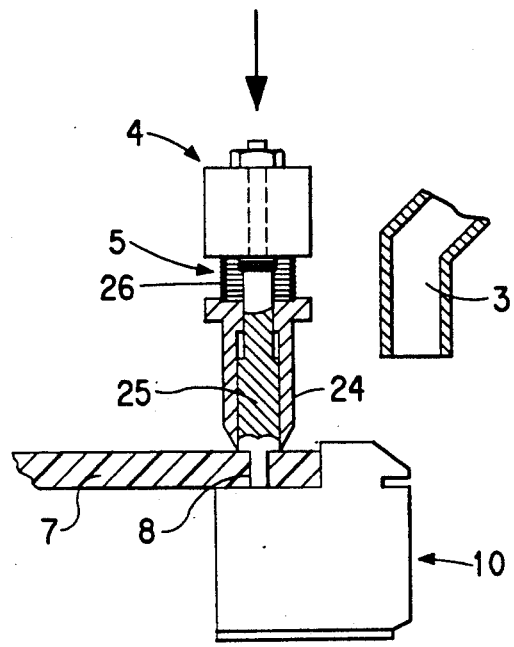

The way in which the heating heads 3 and the pressure heads 5 work is shown in greater detail in FIGS. 3a and 3b. The heating head 3 comprises a hollow pipe through which hot air can be blown in the direction of the pin 9. During heating of the pins 9 the pressure head 5 is at a distance above the pins 9, as also shown in FIG. 3a. Each pressure head 5 comprises a sleeve 24, a die member 25, a first spring 26, a second spring 30 and a block 32. The die member 25 has a die or die surface on a shaft or rod. The die is for upsetting one of the pins 9. The sleeve 24 surrounds the die and has at one end a stop or shoulder 27 for limiting movement of the die member 25. The block 32 is movable, such as threadably rotatable, along and confined on the shaft, such as by a nut threaded on the shaft of the die member 25. The first spring 26 is held between the stop and the block 32. The second spring 30 is held between the shaft of the die member 25 and the block 32. When the block 32 is moved to position the sleeve 24 into contact with the printed circuit board 7 over the head of the pin 9 and force is applied to the block 32 towards the printed circuit board 7, the first and second springs 26,30 compress in such a way that the head of the pin 9 is upset by the die and held fast inside the sleeve 24.

When the pins 9 are heated sufficiently, the heating head 3 is withdrawn as shown in FIG. 3b. The pressure head 5 is then moved downwards, during which the sleeve 24 first of all comes into contact with the surface of the board 7. On pushing further downwards, the spring 26 is depressed and the die 25 is pushed in the direction of the pin 9. Since the latter has become soft as a result of the hot air, it can be deformed to the head 28. Die 25 and sleeve 24 are not heated, in such a way that the head 28 can also be cooled down against rapidly, as a result of which a reliable fixing of the connector 10 onto board 7 is ensured.

Those skilled in the art, having the benefit of the teachings of the present invention as hereinabove set forth, can effect numerous modifications thereto. These modifications are to be construed as being encompassed within the scope of the present invention as set forth in the appended claims.

What is claimed is:

1. A device for fixing a connector having pins on a printed circuit board by inserting the pins through holes in the board and deforming heads of the pins, comprising:

a base frame;

a first carrier having a first end and a second end, the first end bearing heating heads for contactlessly heating the pins, the second end supported on the base frame in such a way that the first carrier can slide with respect to the base frame;

means for providing a hot air flow through the heating heads;

a pair of arms having first ends and second ends, the first ends hingedly fixed to a second end of the first carrier and the second ends of the arms hingedly fixed to the base frame;

a second carrier having a first end and a second end, the first end bearing pressure heads for deforming the heated pin heads, the second carrier second end hingedly connected to the base frame; and a control arm having a first end and a second end, the control arm hingedly connected to the base frame, whereby the first carrier can be pushed to a first position towards the connector pins extending through the printed circuit board where the heating heads are positioned to allow the heating means to heat the pins, then a force can be applied downwards on the first end of the control arm causing the first carrier to move away from the pins and the second carrier to move towards the pins in such a way that the pressure heads come into contact with the pins and deform the heads of the pins fixing the connector on the board.

2. The device of claim 1, further comprising:

a first biasing means connected between the base frame and the control lever for moving the control arm upwards from the pin heads to a retracted position when the downward force is removed from the first end of the control arm; and a second biasing means connected between the second carrier and the base frame for moving the second carrier upwards from the pin heads to a retracted position when the downward force is removed from the first end of the control arm.

3. The device of claim 1, wherein:

the control arm second end is a lever which projects from a control arm pivot in the direction of the first carrier; and the first carrier has a stop, such that when the first end of the control arm is pressed downwards the lever contacts the stop in such a way that the first carrier is moved to a retracted position away from the pins.

4. The device of claim 1, wherein the lever is pivotable about the control arm pivot lying substantially above a hinge point of the second carrier.

5. The device of claim 1, wherein the second carrier is hingedly connected to the base frame approximately just above where the second end of the first carrier is slidably supported on the base frame.

6. The device of claims 1, wherein each of the pressure heads comprises:
 a die member having a die on a shaft, the die for upsetting one of the pins;
 a sleeve which surrounds the die and has at one end a stop for the die;
 a block movable along and confined on the shaft;
 a first spring held between the stop and the block; and
 a second spring held between the shaft and the block,
 such that when the block is moved to position the sleeve into contact with the printed circuit board over the pin head and force is applied to the block towards the printed circuit board, the first and second pre-tensioning devices compress in such a way that the head of the pin is upset by the die and held fast inside the sleeve.

7. The device of claim 1, wherein each one of the heating heads is a pipe connected to the hot air providing means for providing a hot air flow through the pipe to heat one of the pin heads.

8. A method for fixing a connector on a printed circuit board, comprising:
 inserting heads of pins on the connector through holes in the board;
 sliding a first carrier bearing heating heads to a fixing position;
 providing a hot air flow through the heating heads to contactlessly heat the pin heads; and
 applying a downward force on a control arm causing the first carrier to move away from the pins to a retracted position and moving a second carrier bearing low temperature pressure heads towards the pins in such a way that the pressure heads come into contact with the pins and deform the pin heads cooling the pin heads while the pin heads are being deformed and fixing the connector on the board.

9. The method of claim 8, further comprising:
 removing the downward force applied to the control arm causing the control arm to move to a retracted position under the influence of a first biasing means and causing the second carrier to move from the pin heads to a retracted position.

* * * * *